United States Patent
Jin (10) Patent No.: US 11,211,137 B2
(45) Date of Patent: *Dec. 28, 2021

(54) MEMORY SYSTEM WITH DIAGNOSE COMMAND AND OPERATING METHOD THEREOF

(71) Applicant: SK hynix Inc., Gyeonggi-do (KR)

(72) Inventor: Young Tack Jin, Cupertino, CA (US)

(73) Assignee: SK hynix Inc., Gyeonggi-do (KR)

( * ) Notice: Subject to any disclaimer, the term of this patent is extended or adjusted under 35 U.S.C. 154(b) by 136 days.

This patent is subject to a terminal disclaimer.

(21) Appl. No.: 16/572,461

(22) Filed: Sep. 16, 2019

(65) Prior Publication Data

US 2020/0013477 A1 Jan. 9, 2020

Related U.S. Application Data (63) Continuation of application No. 15/812,472, filed on Nov. 14, 2017, now Pat. No. 10,418,121.

(60) Provisional application No. 62/477,319, filed on Mar. 27, 2017.

(51) Int. Cl.
| | |
|---|---|
| *G11C 29/00* | (2006.01) |
| *G11C 29/38* | (2006.01) |
| *G11C 29/12* | (2006.01) |
| *G11C 29/02* | (2006.01) |

(52) U.S. Cl.
CPC .............. *G11C 29/38* (2013.01); *G11C 29/12* (2013.01); *G11C 29/1201* (2013.01); *G11C 29/023* (2013.01); *G11C 29/028* (2013.01)

(58) Field of Classification Search
CPC ....... G11C 29/12; G11C 29/38; G11C 29/023; G11C 29/028; G11C 29/1201

USPC .......................................... 714/718, 742, 63
See application file for complete search history.

(56) References Cited

U.S. PATENT DOCUMENTS

| | | | | |
|---|---|---|---|---|
| 10,082,957 | B2* | 9/2018 | Herman | ................. G06F 3/067 |
| 2008/0148032 | A1* | 6/2008 | Freimuth | ................ G06F 13/42 |
| | | | | 713/1 |
| 2010/0153799 | A1* | 6/2010 | Maroni | .............. G06F 11/2733 |
| | | | | 714/735 |
| 2013/0111117 | A1* | 5/2013 | Yang | ................... G06F 12/0246 |
| | | | | 711/103 |
| 2013/0343250 | A1* | 12/2013 | Homchaudhuri | ........................... |
| | | | | H04W 52/0251 |
| | | | | 370/311 |
| 2014/0129753 | A1* | 5/2014 | Schuette | ............ G06F 13/4068 |
| | | | | 710/301 |
| 2014/0258766 | A1* | 9/2014 | Battyani | .................. G06F 1/04 |
| | | | | 713/502 |
| 2015/0169230 | A1* | 6/2015 | Asnaashari | ........... G06F 3/0688 |
| | | | | 711/103 |

(Continued)

*Primary Examiner* — Albert Decady
*Assistant Examiner* — Osman M Alshack
(74) *Attorney, Agent, or Firm* — IP & T Group LLP (57) ABSTRACT

A memory system and an operating method thereof include: at least a CPU configured to generate a special command; at least a PCIe link coupled with the CPU, wherein the PCIe link includes at least a PCIe switch; and a plurality of memory devices connected with the PCIe switch, wherein each of the plurality of memory devices includes a memory controller, an operational mode switch, and a plurality of memory components, and the operational mode switch is configured to perform a loopback from the memory controller corresponding to the special command at loopback operational mode.

19 Claims, 5 Drawing Sheets

(56) References Cited

U.S. PATENT DOCUMENTS

| | | | |
|---|---|---|---|
| 2015/0254202 A1* | 9/2015 | McGlone | G06F 13/4022 |
| | | | 710/316 |
| 2016/0092328 A1* | 3/2016 | Yeom | G11C 29/38 |
| | | | 714/33 |
| 2017/0052916 A1* | 2/2017 | Kollu | G06F 13/4282 |
| 2018/0004702 A1* | 1/2018 | Pappu | G06F 13/4234 |
| 2018/0034909 A1* | 2/2018 | Nachimuthu | H04L 41/0813 |
| 2018/0091358 A1* | 3/2018 | Sasaki | H04L 43/50 |

* cited by examiner

MEMORY SYSTEM WITH DIAGNOSE COMMAND AND OPERATING METHOD THEREOF

CROSS REFERENCE TO OTHER APPLICATIONS

This application is a continuation of U.S. patent application Ser. No. 15/812,472 filed on Nov. 14, 2017, now U.S. Pat. No. 10,418,121, which claims benefits of priority of U.S. Provisional Patent Application No. 62/477,319 filed on Mar. 27, 2017. The disclosure of each of the foregoing application is incorporated herein by reference in its entirety.

BACKGROUND

Field of Invention

Exemplary embodiments of the present invention relate to an apparatus of semiconductor memory storage system, and more particularly to diagnose SSD and an operation method thereof.

Description of Related Arts

The computer environment paradigm has shifted to ubiquitous computing systems that can be used anytime and anywhere. Due to this fact, the use of portable electronic devices s as mobile phones, digital cameras, and notebook computers has rapidly increased. These portable electronic devices generally use a memory system having memory devices, that is, a data storage device. The data storage device is used as a main memory device or an auxiliary memory device of the portable electronic devices. Thus, the reliability and security of digital data storage, such as a memory system, is critical.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD can include various flash memory components. The two main types of flash memory components are named after the NAND and NOR logic gates. The individual flash memory cells exhibit internal characteristics similar to those of the corresponding gates. The NAND-type flash memory may be written and read in blocks (or pages) which are generally much smaller than the entire device. The NAND-type operates primarily in memory cards, USB flash drives, solid-state drives, and similar products, for general storage and transfer of data.

Diagnosing SSD is always a very important component of any storage solution. Diagnosing SSD links is particularly crucial and needs to be accomplished with less hardware and within reduced diagnose time.

Thus, there remains a need for a semiconductor memory system and operating method thereof having diagnose mechanism. In view of the ever-increasing need to improve performance and security, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a semiconductor memory system and an operating method thereof capable of improving the performance and reliability of a memory system.

In accordance with an embodiment of the present disclosure, there is provided with an apparatus of a memory system which includes: at least a CPU configured to generate a special command; at least a PCIe link coupled with the CPU, wherein the PCIe link includes at least a PCIe switch; and a plurality of memory devices connected with the PCIe switch, wherein each of the plurality of memory devices includes a memory controller, an operational mode switch, and a plurality of memory components, the operational mode switch is configured to perform a loopback from the memory controller corresponding to the special command at loopback operational mode.

In accordance with an embodiment of the present disclosure, there is provided with a method of operating a semiconductor memory system which includes: generating a special command by at least a CPU; coupling at least a PCIe link with the CPU, wherein the PCIe link includes at least a PCIe switch; connecting the PCIe switch with a plurality of memory devices, wherein each of the plurality of memory devices includes a memory controller, an operational mode switch, and a plurality of memory components; and performing a loopback from the memory controller corresponding to the special command at loopback operational mode by the operational mode switch.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

All flash array systems can have multiple levels of peripheral component interconnect express (PCIe) link switches between central processing units (CPUs) and SSDs. The multiple SSDs can be coupled with the CPUs through PCIe links having the multiple PCIe switches, respectively. All interconnections of the CPUs, the PCIe link switches, and the SSDs are arranged in point-to-point topology. For example, 64 SSDs can be coupled with the CPUs through 4 PCIe link switches at 2 hierarchical levels.

To diagnose integrity and reliability of the PCIe links rather than internal data of the SSDs, all data of all the SSDs may be erased and latency performance data from the multiple SSDs may be collected. However, erasing all the data of all the SSDs and recovering them when performing the PCIe link diagnosis may require a lot of data relocation and recovery, such as unmapped reads, resulting in a heavy burden of the flash array systems. The unmapped reads are reads from the SSDs whose entire data is erased and may be backed up and restored later. As the storage capacity becomes bigger, the time to back up and restore can be proportionally longer, and the overhead for the storage backup can be unpractically large.

When diagnose the multiple PCIe links between the CPUs and SSDs, latency statistic for massive read commands may be a critical factor to measure. Latency is the turnaround time measured from the host sending read commands, to the host receiving the data or acknowledge of SSDs responding to the host's read commands. If the sending of read commands and receiving of the data or acknowledge are negatively impacted due to malfunction of the PCIe link switches, the latency statistic including a set of measured latencies can be worse than normal latencies in a normal condition. By comparing the measured latency statistic with the normal latencies, the PCIe links can be evaluated and any malfunctioned PCIe link switches can be identified, when the latency statistic is longer than the normal latency.

When measuring the latency statistic on the storage media, such as NAND memory, the time of returning the data from the storage media can be long, resulting in a much longer latency statistic. By eliminating unmapped reads, such as no access to the storage media, the measured latencies statistic can be reduced significantly. The measured latencies can be as short as 30 usec without the unmapped reads, while the latencies with the unmapped reads can be 110 usec. Thus, the time reduction for collecting several million samples can be huge.

The embodiments of the present invention introduce a memory system and operating method thereof with a special command for diagnose the memory media, such as the SSDs. Rather than data backup and restore of the entire SSDs only for the PCIe links diagnosis, the special command can configure the SSD operational mode to switch between loopback and normal operational modes, and avoid accessing the NANDs for data backup and restore. The SSDs can be configured to the loopback operational mode during the PCIe links diagnosis, and be switched back to the normal operational mode after the PCIe links diagnosis is completed.

The system user can use the special command to measure the latencies of the PCIe links, whenever the storage system shows suspicious higher latencies of the PCIe links. According to the measured latency statistic, any malfunctioned links can be identified as long as all other components in the PCIe links including terminal nodes and the SSDs function normally.

Figure 1:
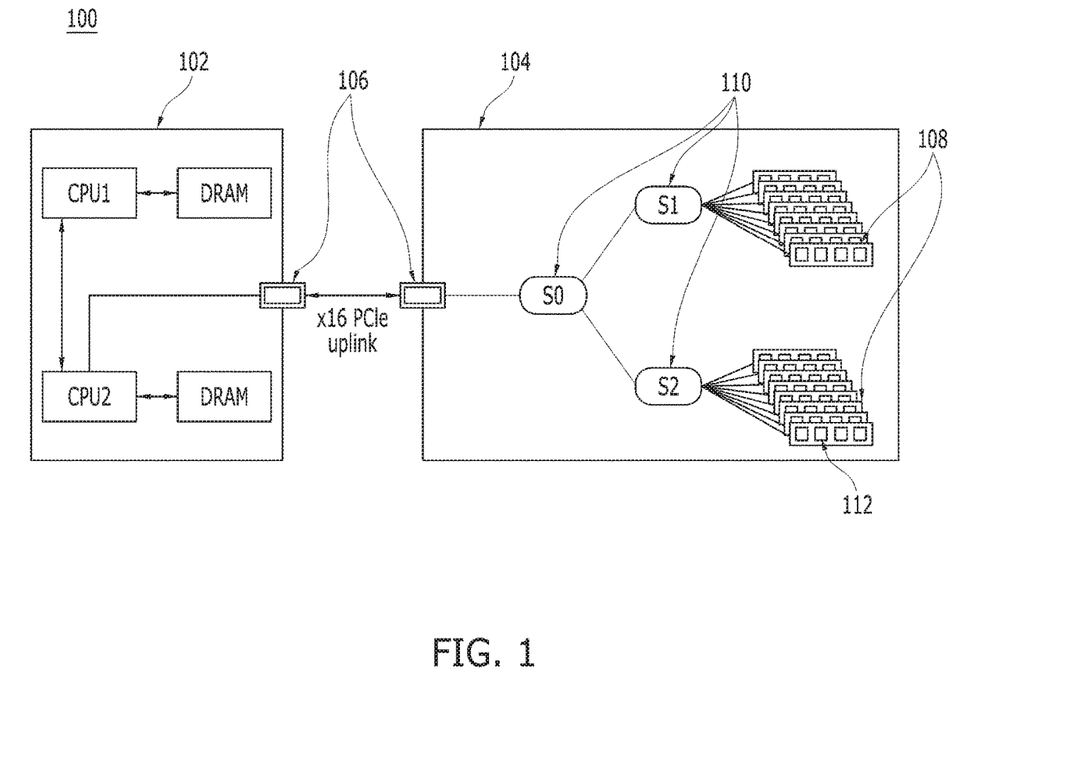
FIG. 1 is a block diagram schematically illustrating a flash array system in accordance with an embodiment of the present invention.

Referring now to FIG. 1, herein is shown a block diagram schematically illustrating a flash array in accordance with an embodiment of the present invention. A memory system 100 can comprise a server 102 and a flash array 104, wherein the flash array 104 can be coupled with the server 102 through PCIe extender cards 106, such as x16 PCIe uplink. The flash array 104 can include one of the PCIe extender cards 106 coupled with SSD cards 108 through PCIe switches 110. A PCIe extender-PCIe extender can be used to connected the PCIe extender cards 106 as shown in FIG. 1.

The server 102 can include at least one CPU, wherein the at least one CPU can be coupled with the flash array 104 through the PCIe extender cards 106, and the at least one CPU can be connected with one of the PCIe extender cards 106 by a CPU-PCIe extender. The flash array 104 can include rows of the SSD cards 108, wherein each of the SSD cards 108 can carry multiple SSDs 112. The SSD cards 108 can be divided into multiple groups, and the SSD cards 108 in each group can share one of the PCIe switches 110 at a lower hierarchical level. The PCIe switches 110 at the lower hierarchical level can be connected with each other and further coupled with one of the PCIe extender cards 106, through one of the PCIe switches 110 at a higher hierarchical level.

For example, as shown in FIG. 1, the server 102 can have 2 CPUs including CPU1 and CPU2. One of the CPUs, such as CPU2, can be connected with one of the PCIe extender card 106. The flash array 104 can include e multiple SSD cards 108 divided into multiple groups, such as 16 SSD cards divided into 2 groups. Each of the SSD cards 108 can carry multiple SSDs 112, such as 4 SSD 112 carried in each of the SSD cards 108. Each group of the SSD cards 108 can be connected through one of the PCIe switches 110 at the lower hierarchical level, such as S1 and S2, and further coupled to the PCIe extender card 106 via one of the PCIe switches 110 at the higher hierarchical level, such as S0. The PCIe extender cards 106 can be connected with each other. The PCIe switches 110 can be arranged in multiple hierarchical levels, such as 2 hierarchical levels shown in FIG. 1.

Figure 2:
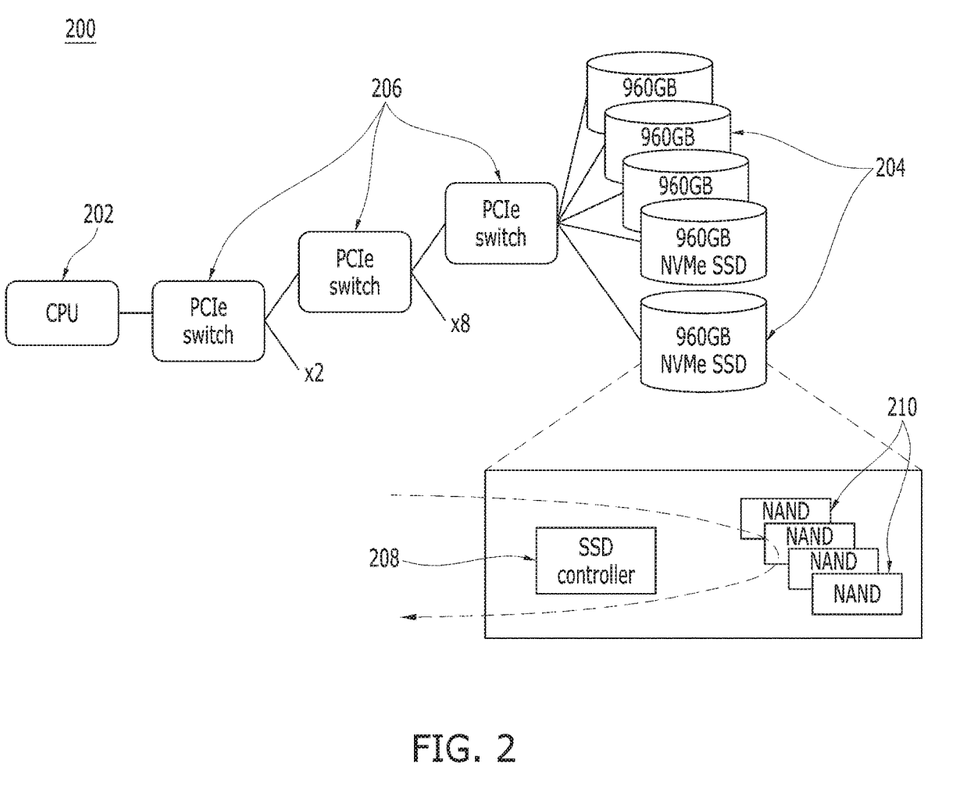
FIG. 2 is a block diagram schematically illustrating normal operational mode of a flash array system in accordance with an embodiment of the present invention.

Referring now to FIG. 2, herein is shown a block diagram schematically illustrating normal operational mode of a flash array system in accordance with an embodiment of the present invention. A memory system 200 can comprise at least one CPU 202 and a flash array, wherein the flash array including multiple SSDs 204 can be coupled with the CPU 202 through PCIe links including PCIe switches 206. Each of the SSDs 204 can comprise a SSD controller 208 and multiple NANDs 210. At normal operational mode, the CPU 202 can send the read commands to read data from the NANDs 210, and the NANDs 210 can return read data to the host, through the PCIe links, as shown in FIG. 2. The latency can be measured from the time when the CPU 202 sending the read commands to the NANDs 210, to the CPU 202 receiving data and acknowledge from the NANDs 210.

The measured latency can comprise all the delays in the PCIe links hieratically, including all the delays of the PCIe switches 206 in the PCIe links, and the responding time of the NANDs 210 for returning the data and acknowledge to the host. Since the time for reading the NANDs 210 can be long, the entire measured latency may be prolonged by the time for reading the NANDs 210, at the normal operational mode.

Figure 3:
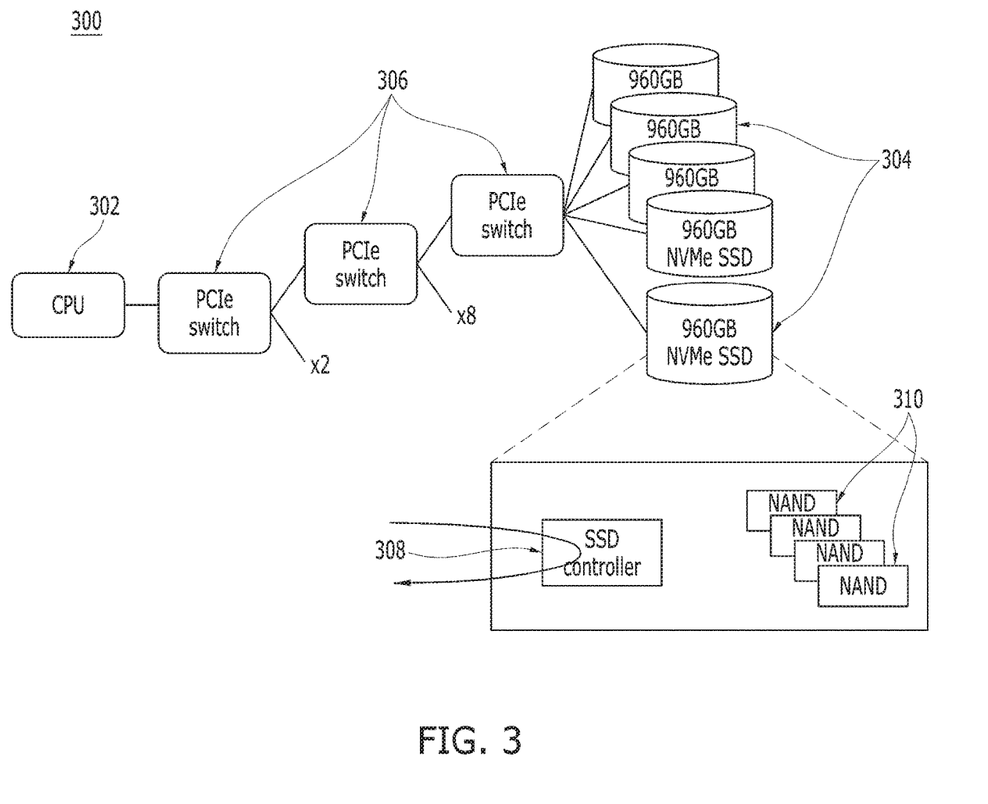
FIG. 3 is a block diagram schematically illustrating loopback operational mode of a flash array system in accordance with an embodiment of the present invention.

Referring now to FIG. 3, herein is shown a block diagram schematically illustrating loopback operational mode of a flash array system in accordance with an embodiment of the present invention. A memory system 300 can comprise at least one CPU 302 and a flash array, wherein the flash array including multiple SSDs 304 can be coupled with the CPU 302 through PCIe links including PCIe switches 306. Each of the SSDs 304 can comprise a SSD controller 308 and multiple NANDs 310. At loopback operational mode, the reads operation instructed by the special command can be performed including sending read commands from the CPU 302 to the SSD controller 308 and returning acknowledge from the SSD controller 308, without accessing the NANDs 310, such as the unmapped reads of erasing and restoring all the data in the NANDs 310 may not be performed, as shown in FIG. 3. The latency can be measured from the time when CPU 302 sending the read commands to the SSD controller 308, to the CPU 302 receiving data or acknowledge from the SSD controller 308.

The measured latency can comprise all the delays in the PCIe links hieratically, including all the delays of the PCIe switches 306 in the PCIe links, and the responding time of the SSD controller 308 for acknowledging to the CPU 302. Without accessing the NANDs 310, the time for reading the NANDs 310 can be eliminated by using the special command in the loopback operational mode, such that the entire measured latency can be reduced significantly since the responding time of the SSD controller 308 is much shorter than that of the NANDs 310.

Figure 4:
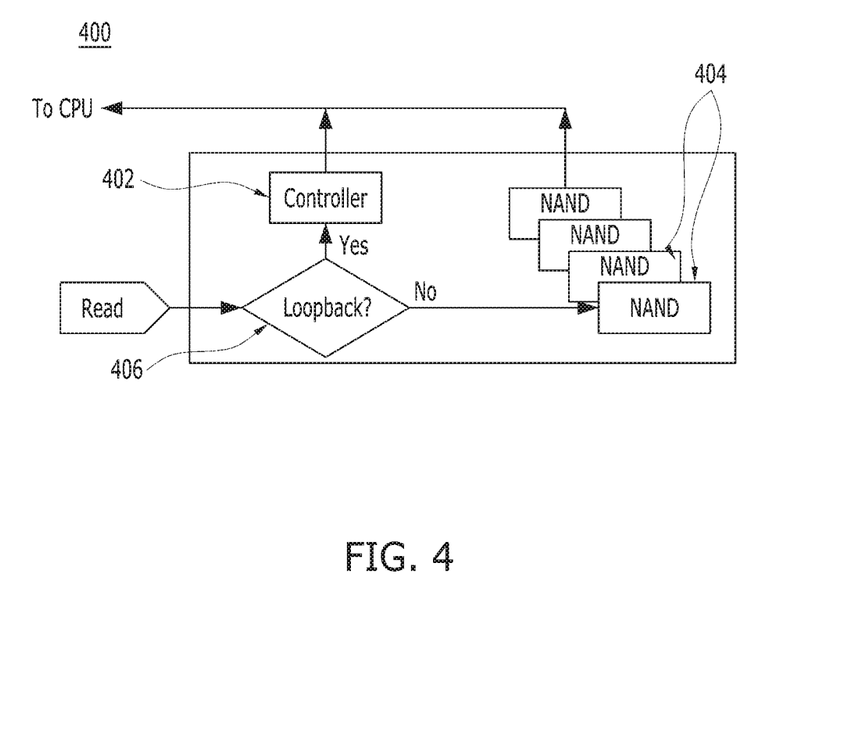
FIG. 4 is a diagram schematically illustrating operational mode of flash array system in accordance with an embodiment of the present invention.

Referring now to FIG. 4, herein is shown a diagram schematically illustrating operational mode of a flash array system in accordance with an embodiment of the present invention. The flash memory system comprises multiple SSDs 400, each of the SSDs 400 can include a SSD controller 402, an operational mode switch 406, and multiple NANDs 404.

The operational mode switch 406 can determine whether the read command is executed at normal operational mode or loopback operational mode. During the normal operation, the operational mode switch 406 can switch the data path for read data normally from the NANDs 404. The read command can be executed at normal operational mode, such that the read command can instruct the SSD controller 402 to access the NANDs 404 and return read data or acknowledge from the NANDs 404. The execution time of the read command at the normal operational mode can include the time access and return the read data from the NANDs 404.

During the special mode, such as loopback operational, the operational mode switch 406 can switch the data path for send read command and receiving acknowledge from the SSD controller 402. The read command can be executed at the loopback operational mode, such that the read command can instruct the SSD controller 402 to return acknowledge or data, without access the NANDs 404. The execution time of the read command at the loopback operational mode can include the time that SSD controller 402 returning the acknowledge signal, but the time for access the NANDs 404 or return read data from the NANDs 404 can be eliminated.

In the embodiments of the present invention, the operational mode switch 406 of the SSDs 400 can determine and switch to the operational mode the read commands execute at, such as loopback operational mode or normal operational mode. Each of the operational mode can be executed following different data path, resulting in different latencies. The read command execution at the loopback operational mode can significantly reduce the latency thereof by eliminating the access time to the NANDs 404. The operational mode switch 406 can be configured to switch the operational mode between the normal operational mode and the loopback operational mode.

It has been discovered that utilizing a special command including a read operation at loopback operational mode, the significantly reduced latency of the PCIe links can provide huge time saving for collecting several million samples, resulting in a short diagnose procedure. And the elimination of erase and restore the data of all NANDs, not only reduce the latency, but also reduce the overhead for the storage backup.

Figure 5:
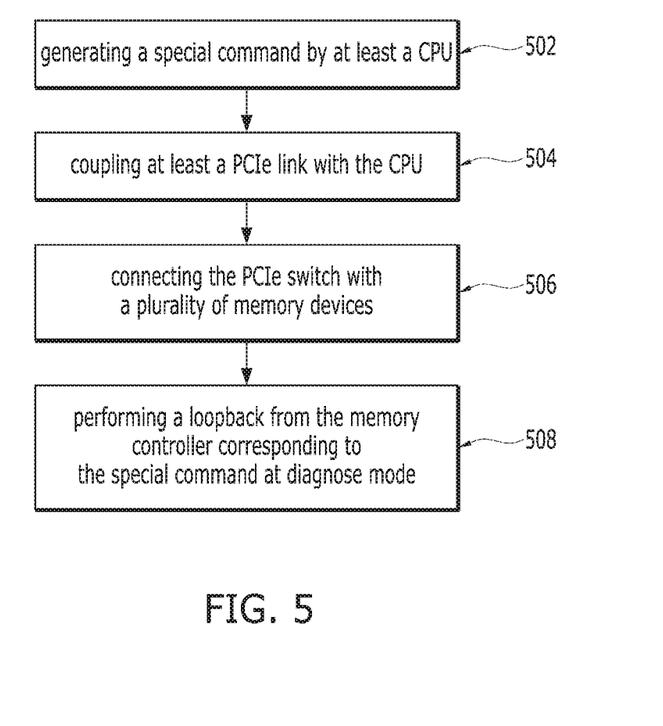
FIG. 5 is a flowchart illustrating an operating method of a memory system in accordance with an embodiment of the present invention.

Referring now to FIG. 5, herein is shown a flowchart illustrating an operating method of a memory system in accordance with a further embodiment of the present invention. An operating method of a memory system comprising: generating a special command by at least a CPU in a block of 502; coupling at least a PCIe link with the CPU, wherein the PCIe link includes at least a PCIe switch in a block of 504; connecting the PCIe switch with a plurality of memory devices, wherein each of the plurality of memory devices includes a memory controller, an operational mode switch, and a plurality of memory components in a block of 506; and performing a loopback from the memory controller corresponding to the special command at loopback operational mode by the operational mode switch in a block of 508.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A memory system comprising:
   a central processing unit (CPU) configured to generate a special command;

a peripheral component interconnect express (PCIe) link coupled with the CPU; and a plurality of memory devices connected with the PCIe link;

wherein each of the plurality of memory devices includes a memory controller, and a plurality of memory components, and the memory controller switches an operational mode of memory devices between loopback and normal operational modes corresponding to the special command from the CPU, and wherein the CPU is further configured to measure latencies with the special command and diagnose the interfacePCIe link by comparing latencies of the loopback operational mode with normal latencies.

2. The memory system recited in claim 1, wherein the special command includes a read command returning an acknowledge signal from the memory controller in the loopback operational mode, without accessing the memory components.

3. The memory system recited in claim 1, wherein the special command includes a read command returning an acknowledge signal and read data from the memory components in the normal operational mode.

4. The memory system recited in claim 1, wherein the CPU is further configured to determine that the PCIe link malfunctioned when a latency statistic including a set of measured latencies is greater than the normal latencies.

5. The memory system recited in claim 1, wherein the normal latencies are latencies of the PCIe link in a normal condition.

6. The memory system recited in claim 1, wherein the PCIe link includes at least one PCIe switch.

7. A memory system comprising:
a central processing unit (CPU);
a peripheral component interconnect express (PCIe) link coupled with the CPU; and
a plurality of memory devices connected with the PCIe link, wherein each of the plurality of memory devices includes a memory controller, an operational mode switch, and a plurality of memory components, and the operational mode switch is configured to determine whether the memory devices are executed in a normal operational mode or in a loopback operational mode,
wherein the CPU is further configured to measure latencies and diagnose the PCIe link by comparing latencies of the loopback operational mode with normal latencies.

8. The memory system recited in claim 7, wherein the CPU sends a read command and the read command can instructinstructs the memory controller to return acknowledge or data, without access the memory components.

9. The memory system recited in claim 7, wherein the CPU sends a read command and the read command instructs the memory controller to return acknowledge and read data from the memory components in the normal operational mode.

10. The memory system recited in claim 7, wherein the CPU is further configured to determine that the PCIe link malfunctioned when a latency statistic including a set of measured latencies is greater than the normal latencies.

11. The memory system recited in claim 7, wherein the normal latencies are latencies of the PCIe link in a normal condition.

12. The memory system recited in claim 7, wherein the PCIe link includes at least one PCIe switch.

13. A memory system comprising:
a central processing unit (CPU) configured to generate a special command;
a peripheral component interconnect express (PCIe) link coupled with the CPU, wherein the PCIe link includes at least one PCIe switch; and
a plurality of memory devices connected with the at least one PCIe switch,
wherein each of the plurality of memory devices includes a memory controller, an operational mode switch, and a plurality of memory components, and the operational mode switch is configured to perform a loopback from the memory controller corresponding to the special command,
wherein the CPU is further configured to measure latencies and diagnose the PCIe link by comparing latencies of the loopback operational mode with normal latencies.

14. The memory system recited in claim 13, wherein the at least one PCIe switch includes multiple PCIe switches arranged in multiple hierarchical levels.

15. The memory system recited in claim 13, wherein the special command includes a read command returning an acknowledge signal from the memory controller in the loopback operational mode, without accessing the memory components.

16. The memory system recited in claim 13, wherein the special command includes a read command returning an acknowledge signal and read data from the memory components in a normal operational mode.

17. The memory system recited in claim 13, wherein the CPU is further configured to determine that the PCIe link malfunctioned when a latency statistic including a set of measured latencies is greater than the normal latencies.

18. The memory system recited in claim 13, wherein the normal latencies are latencies of the PCIe link in a normal condition.

19. The memory system recited in claim 13, wherein the plurality of memory components is divided into multiple groups.

* * * * *